(12) United States Patent
Hata et al.

(10) Patent No.: US 7,782,618 B2
(45) Date of Patent: Aug. 24, 2010

(54) ELECTRONIC EQUIPMENT

(75) Inventors: Koji Hata, Yokohama (JP); Hiroshi Kuwaki, Fujisawa (JP); Yasushi Kimura, Yokohama (JP); Shinya Hamagishi, Fujisawa (JP)

(73) Assignee: Hitachi, Ltd., Tokyo (JP)

( * ) Notice: Subject to any disclaimer, the term of this patent is extended or adjusted under 35 U.S.C. 154(b) by 100 days.

(21) Appl. No.: 12/022,189

(22) Filed: Jan. 30, 2008

(65) Prior Publication Data

US 2009/0059534 A1 Mar. 5, 2009

(30) Foreign Application Priority Data

Aug. 28, 2007 (JP) ............................. 2007-221425

(51) Int. Cl.
*H05K 7/20* (2006.01)
*H05K 5/00* (2006.01)

(52) U.S. Cl. .................. 361/704; 361/690; 361/703; 361/722; 165/185; 174/520; 174/526; 312/100; 312/223.1; 312/229; 312/236

(58) Field of Classification Search .............. 361/676, 361/690, 702–704; 165/80.3, 185; 312/100, 312/223.1, 229, 236; 174/520, 526
See application file for complete search history.

(56) References Cited

U.S. PATENT DOCUMENTS 4,152,096 A * 5/1979 Murakami et al. .......... 415/200
4,335,273 A * 6/1982 Levin ......................... 277/641
6,407,925 B1 * 6/2002 Kobayashi et al. .......... 361/752
6,707,678 B2 * 3/2004 Kobayashi et al. .......... 361/752
6,749,498 B2 * 6/2004 Pfister ......................... 454/184
6,789,612 B1 * 9/2004 Okamoto et al. ......... 165/104.34
7,100,682 B2 * 9/2006 Okamoto et al. ......... 165/104.34
7,436,660 B2 * 10/2008 Pedoeem et al. ............ 361/690
2008/0158830 A1 * 7/2008 Tominaga et al. ........... 361/722

FOREIGN PATENT DOCUMENTS

| JP | 5-69980 | 9/1993 |
| JP | 10-173371 | 6/1998 |
| JP | 11-230583 | 8/1999 |
| JP | 2000307276 A * | 11/2000 |
| JP | 2003-101266 | 4/2003 |

OTHER PUBLICATIONS

English translation of Sugiyama et al. (JP11-230583).*
English translation of Sugiyama, JP11-230583, Published Aug. 27, 1999. Machine translation retrieved on Dec. 7, 2009.*

* cited by examiner

*Primary Examiner*—Jayprakash N Gandhi
*Assistant Examiner*—Robert J Hoffberg
(74) *Attorney, Agent, or Firm*—Antonelli, Terry, Stout & Kraus, LLP.

(57) ABSTRACT

In order to ensure waterproofing between a resin enclosure case and a heat sink, a canopy structure is provided in a portion, in which water is likely to penetrate, so as to prevent the water from entering the portion, thereby directing the water flow to the outside of the enclosure. This makes it easy to install and remove an electronic unit, so that an electronic component integrally formed with the heat sink can be easily replaced.

14 Claims, 8 Drawing Sheets

ELECTRONIC EQUIPMENT

CLAIM OF PRIORITY

The present application claims priority from Japanese patent application serial no. 2007-221425, filed on Aug. 28, 2007, the content of which is hereby incorporated by reference into this application.

BACKGROUND OF THE INVENTION

The present invention relates to electronic equipment, and more particularly to electronic equipment installed outdoors.

Outdoor equipment enclosures for North America must successfully complete the standards of North America. Particularly, it is necessary to pass the following three tests relating to waterproofing, which are described in "Generic Requirements for Electronic Equipment Cabinets", Telcordia Technologies, March 2000, GR-487-CORE issue 2, Section 3.28. Incidentally, Wind Driven Rain test is the most severe of the three tests.

1. Wind Driven Rain test

After water spraying on the front surface, right surface, and left surface of an enclosure for 30 minutes each with a rainfall intensity of 150 mm/hr and a wind speed of 31 m/sec, the amount of water penetrating into the enclosure shall not exceed 1 cm^3 ($cm^3$) (1 gram of water) per 0.028 m^3 ($m^3$) (1 ft^3 ($ft^3$)).

2. Rain Intrusion Test

Water droplets accumulated in the surface grooves and the door frame shall not enter the enclosure immediately after heavy rain. After water spraying on the front surface and the two side surfaces for 15 minutes each, the amount of water penetrating into the enclosure shall not exceed 1 cm^3 ($cm^3$) (1 gram of water) per 0.028 m^3 ($m^3$) (1 ft^3 ($ft^3$)).

3. Lawn Sprinklers Test

After simulation of sprinkler water spraying at a downward angle of 45 degrees on the front surface and the two side surfaces for 15 minutes or 45 minutes in total, the amount of water penetrating into the enclosure shall not exceed 1 cm^3 ($cm^3$) (1 gram of water) per 0.028 m^3 ($m^3$) (1 ft^3 ($ft^3$)).

Meanwhile, IPX4 defined in international standard IEC/EN60529 (JIS C0920) also specifies as criteria that water splashing against the enclosure shall have no harmful effect. In other words, the provisions of "Generic Requirements for Electronic Equipment Cabinets", Telcordia Technologies, March 2000, GR-487-CORE issue 2, Section 3.28 are unique in that they require the prevention of water penetration, in addition to the protection against harmful effect of water splash.

In addition to the waterproof standard described above, the outdoor equipment enclosure for North America should meet the requirement that an electronic component housed therein can easily be replaced. In other words, the enclosure should have a structure capable of replacing an internal unit including an electronic component within the enclosure, instead of replacing the whole equipment, for the maintenance and replacement of the equipment. This is also the specification that allows the installation of the enclosure first and then the installation of the internal unit afterwards.

Further, from the point of view of the cost and weight, the material of the enclosure is preferably resin. However, it is difficult for a resin seal enclosure to fully achieve radiation performance. Hence, it is necessary to ensure the radiation performance by providing an opening in the resin enclosure through which a radiation fin of a heat sink thermally connected to the electronic component, is partially exposed to the outside of the resin enclosure. Here, the heat fin may be splashed with water, but the water penetration into portions other than the radiation fin is not allowed.

In general, the electronic component and the heat sink are connected via a thermally conductive sheet. For this reason, it is difficult to remove only a board in which the electronic component is mounted for maintenance and replacement, so that the electronic component is removed and replaced together with the heat sink.

In JP-A No. Hei 10-173371, there is described an enclosure structure of electronic equipment that facilitates heat conduction from the inside to the outside of the enclosure. The enclosure structure is designed to improve the efficiency of radiation from the inside to the outside of the enclosure, by providing a heat sink for radiating heat from the inside out, in which a radiation surface of the heat sink is exposed out to the bottom of the enclosure. However, this structure uses a packing (O-ring) for waterproofing. The use of the packing requires precise control of the amount of crush of the packing, thereby requiring a lot of screws for tightening the packing. Further, it is also necessary to manage a tightening torque. Consequently, it is difficult to easily install and remove the internal unit.

SUMMARY OF THE INVENTION

The present invention provides electronic equipment installed outdoors to house an electronic component and other parts, in which the electronic equipment meets the waterproof standard of North America and allows easy replacement of the electronic component housed therein.

The above can be achieved by electronic equipment including: an electronic component installed in an enclosure with a cover and a case having an opening; and an internal unit including a radiation fin and a heat sink for radiating heat generated by the electronic component, the radiation fin being inserted into the opening. The heat sink has a draining portion extending in a direction perpendicular to an extending direction of the radiation fin, in the bottom of the radiation fin.

Further, it can be achieved by electronic equipment including: an electronic component installed in an enclosure with a cover and a case having an opening; and an internal unit including a radiation fin and a heat sink for radiating heat generated by the electronic component, the radiation fin being inserted into the opening. The heat sink has a draining portion extending in a direction perpendicular to an extending direction of the radiation fin, in the bottom of the heat sink.

BRIEF DESCRIPTION OF THE DRAWINGS

Preferred embodiments of the present invention will now be described in conjunction with the accompanying drawings, in which.

DESCRIPTION OF THE PREFERRED EMBODIMENTS

Figure 1:
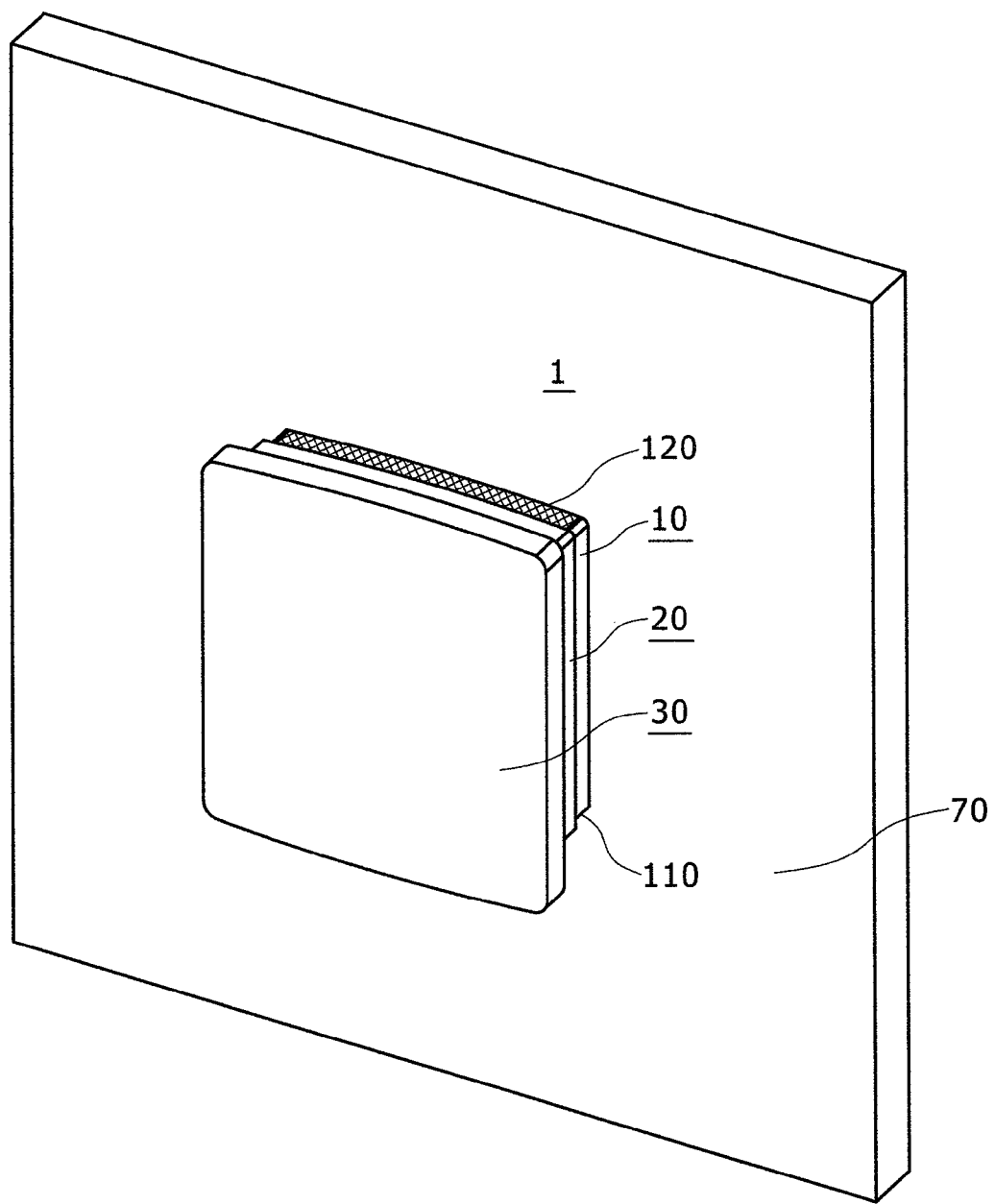
FIG. 1 is a perspective view showing a state in which an enclosure is mounted to an outdoor wall surface.
Figure 2:
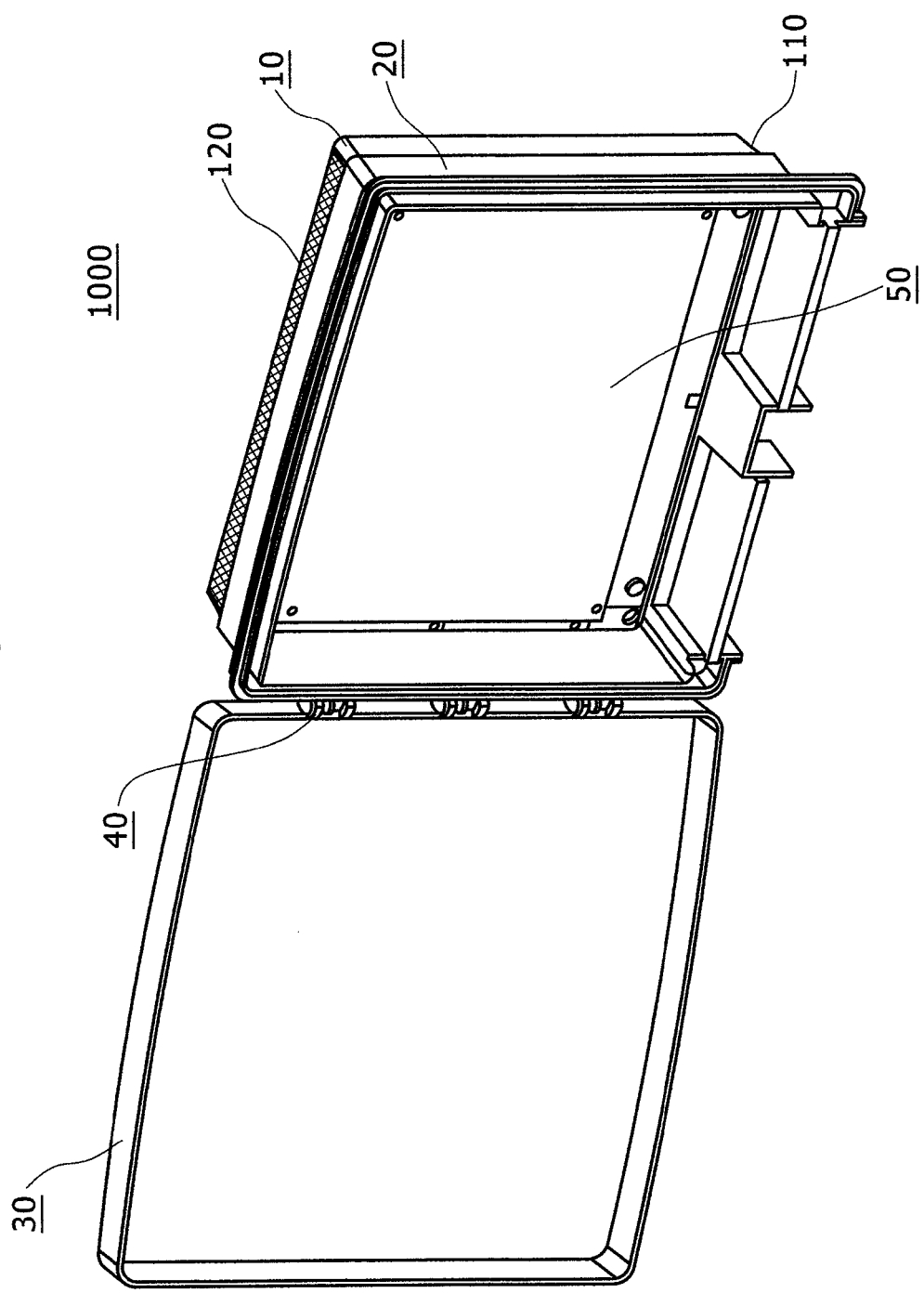
FIG. 2 is a perspective view showing a state in which a cover of the enclosure of electronic equipment is opened.
Figure 3:
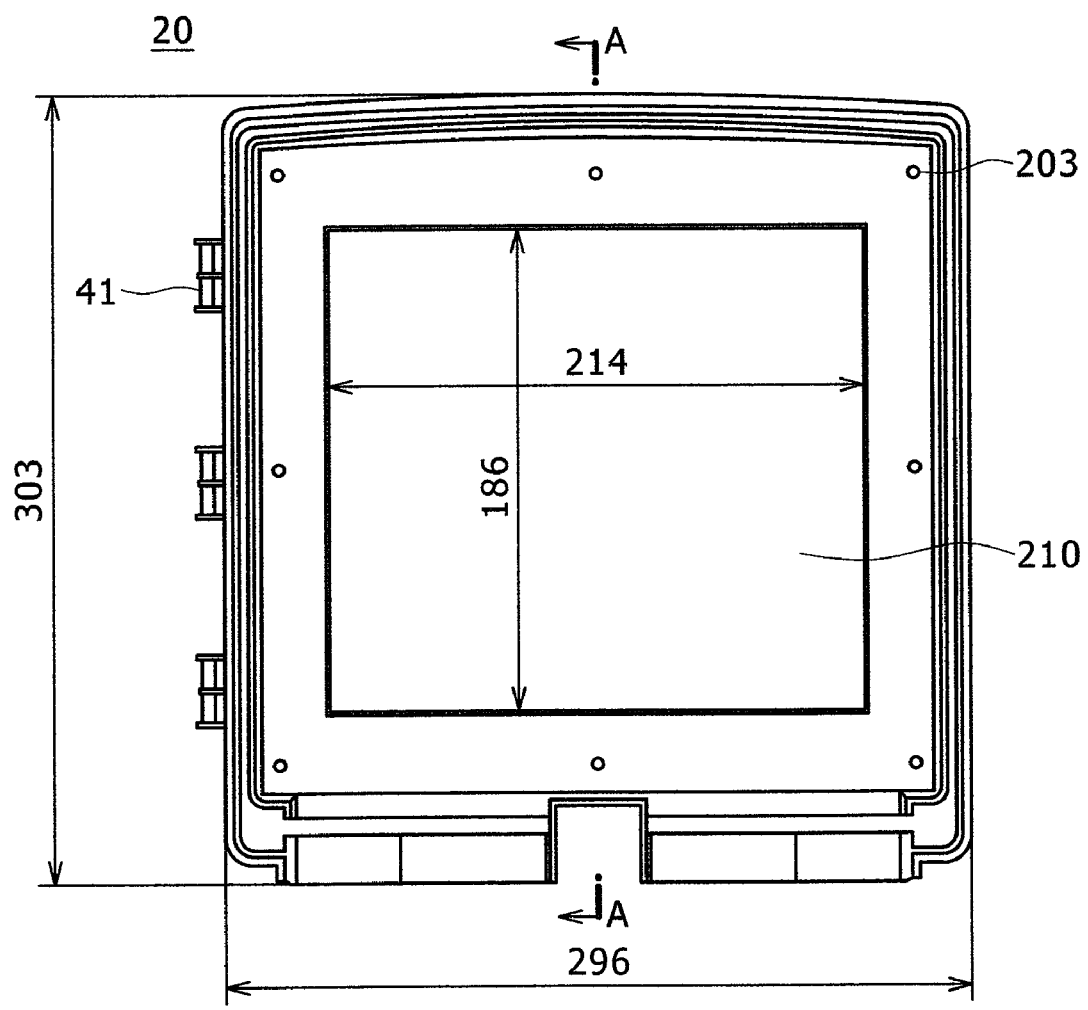
FIG. 3 is a front view of a case.
Figure 4:
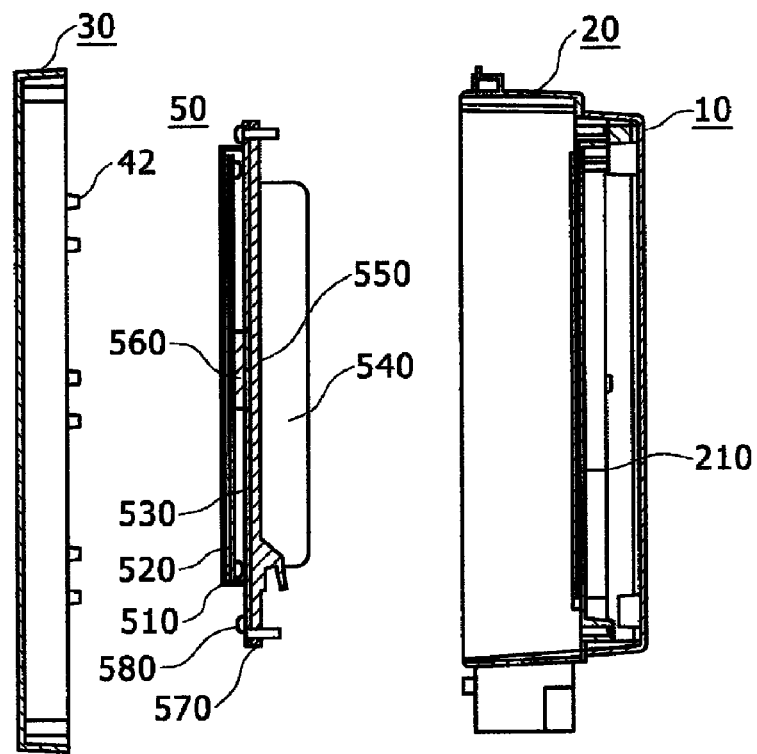
FIG. 4 is a cross-sectional view of an assembly of the electronic equipment.
Figure 5:
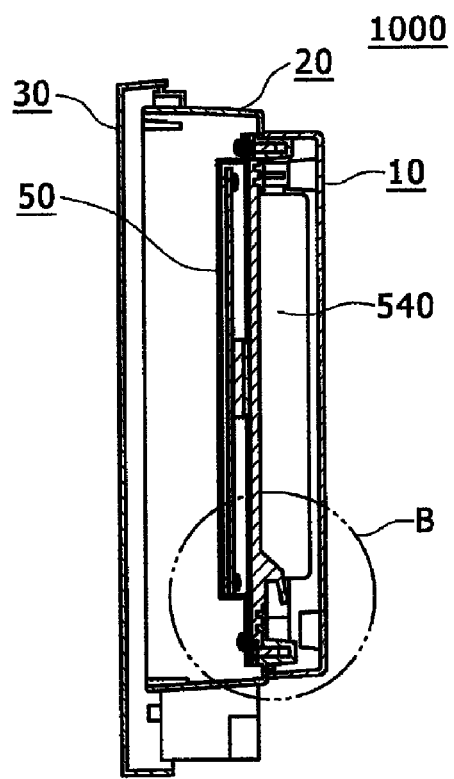
FIG. 5 is a cross-sectional view of the electronic equipment.
Figure 6:
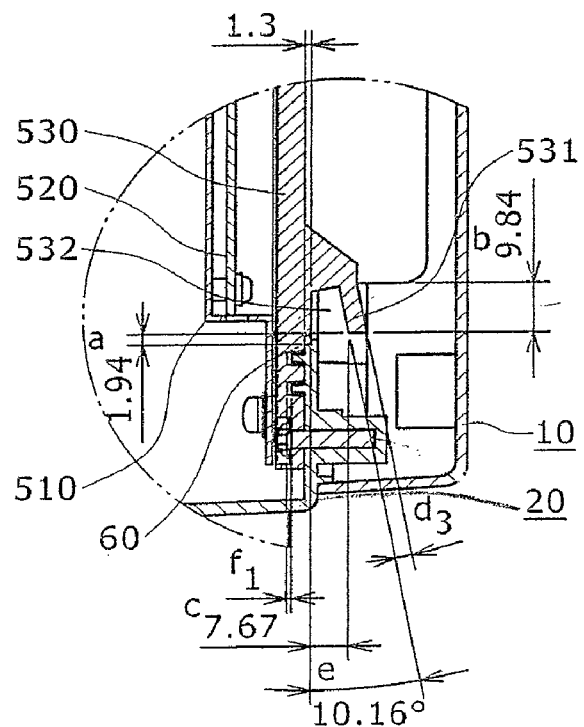
FIG. 6 is a cross-sectional view of a key portion of the electronic equipment.
Figure 7:
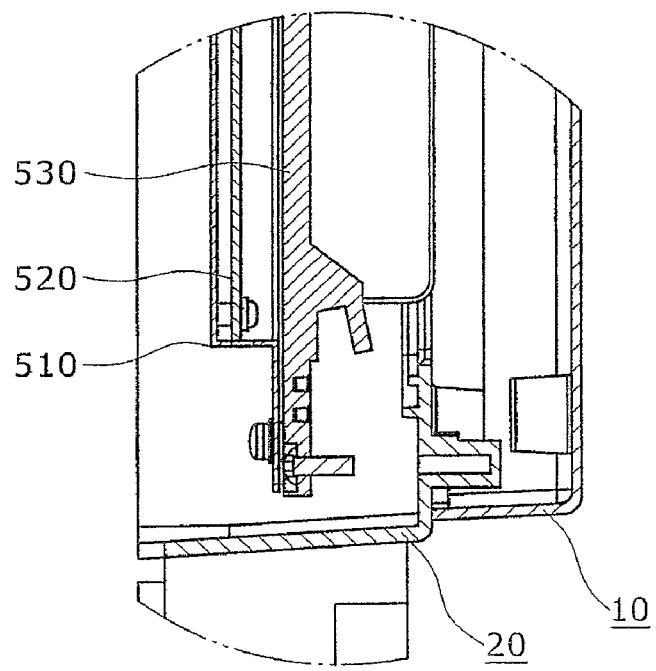
FIG. 7 is an assembly view of a key portion of the electronic equipment.
Figure 8:
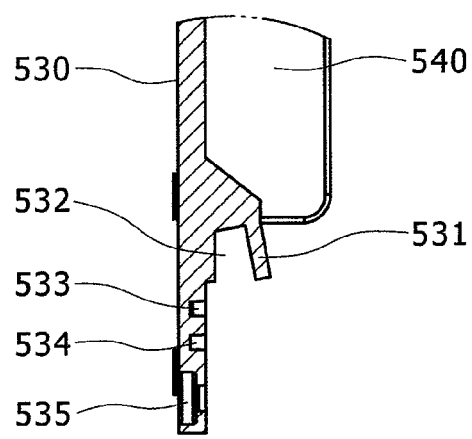
FIG. 8 is a cross-sectional view showing in detail a canopy structure of a heat sink.
Figure 9:
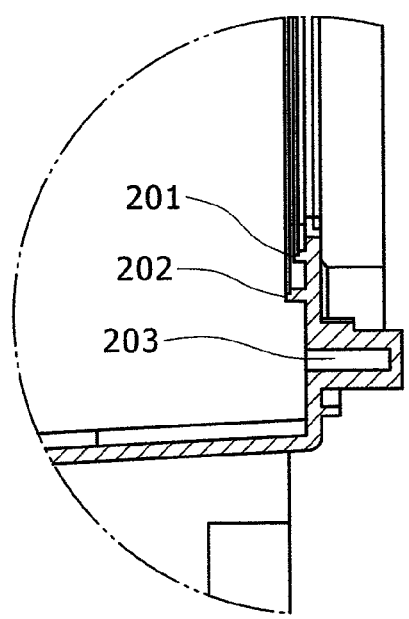
FIG. 9 is a cross-sectional view showing in detail a portion for waterproofing of the case.
Figure 10:
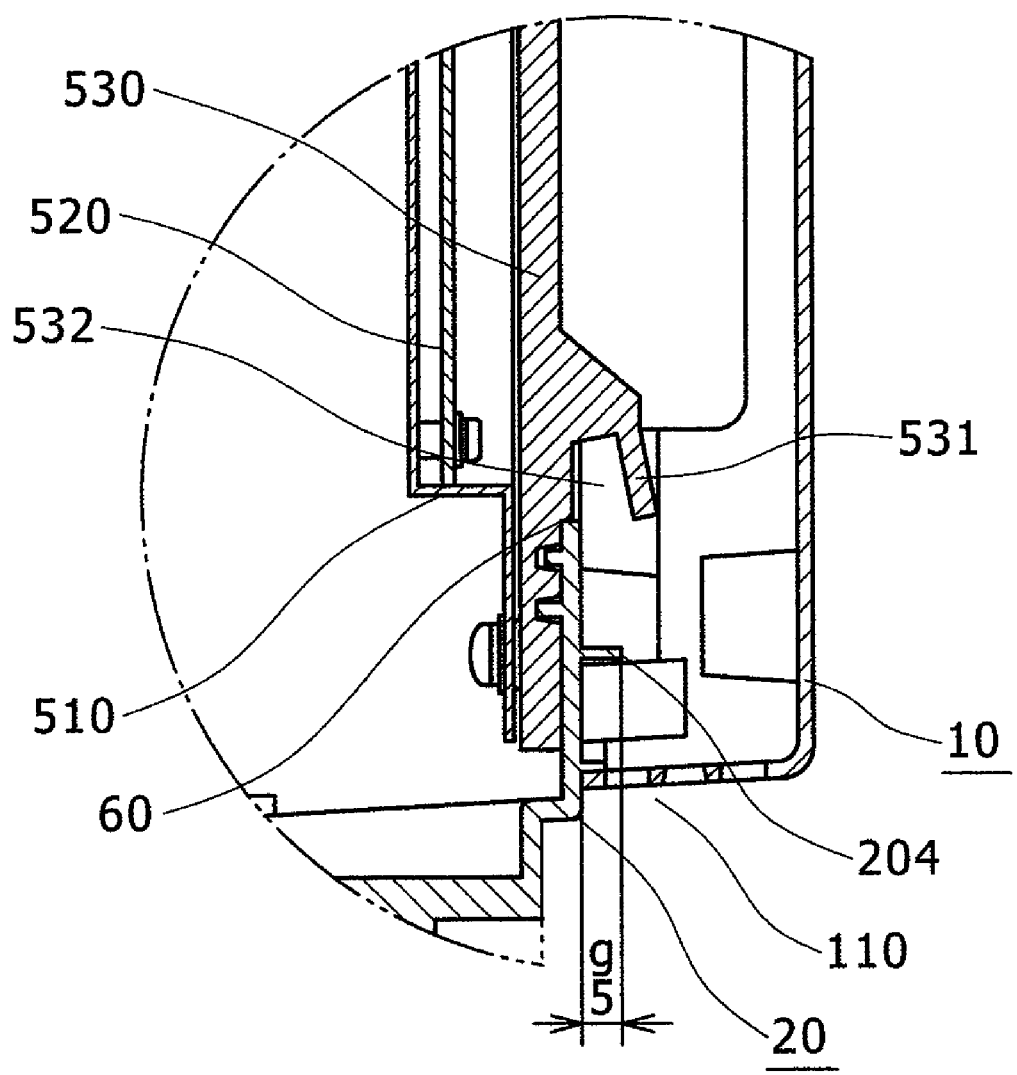
FIG. 10 is another cross-sectional view in the vicinity of the canopy structure.

Hereinafter, embodiments will be described based on examples, with reference to the accompanying drawings. Like or corresponding parts are denoted by the same reference numerals and the description will not be repeated. Here, FIG. 1 is a perspective view showing a state in which an enclosure is mounted to an outdoor wall surface. FIG. 2 is a perspective view showing a state in which a cover of the enclosure of electronic equipment is opened. FIG. 3 is a front view of a case. FIG. 4 is a cross-sectional view of an assembly of the electronic equipment. FIG. 5 is a cross-sectional view of the electronic equipment. FIG. 6 is a cross-sectional view of a key portion of the electronic equipment. FIG. 7 is an assembly view of a key portion of the electronic equipment. FIG. 8 is a cross-sectional view showing in detail a canopy structure of a heat sink. FIG. 9 is a cross-sectional view showing in detail a portion for waterproofing of the case. FIG. 10 is another cross-sectional view in the vicinity of the canopy structure.

In FIG. 1, an outdoor enclosure 1 includes a heat sink cover 10, a case 20, and a cover 30, and is fixed to a wall 70. The heat sink cover 10, the case 20, and the cover 30 are all made of resin. The heat sink cover 10 has a lower air vent 110 and an upper air vent 120 for cooling streams. It is designed so that an internal unit can be installed later in a state in which the outdoor enclosure 1 is fixed to the wall 70.

Incidentally, the lower air vent is not seen in FIG. 1 due to perspective viewing, but it is explicitly shown in FIG. 10 which will be described later.

FIG. 2 shows electronic equipment 1000 with the cover 30 open. The electronic equipment 1000 is in a state in which an internal unit 50 is connected to the outdoor enclosure 1. Incidentally, in FIG. 2, the cover 30 and the case 20 are connected by hinges 40, but it is also possible that the cover 30 may be removable and fixed to the case 20 by screws. Further, the cover 30 and the case 20 are resin sealed, so that it is possible to easily realize a water seal structure.

Incidentally, in order to simplify the illustration, there is shown that the height of the internal unit 50 is low relative to the depth of the case 20.

The case 20 will be described with reference to FIG. 3. In FIG. 3, the maximum profile of the case 20 is substantially square with 303×296 mm sides. The case 20 has frame-side hinge portions 41 on the left side surface, and an opening 210 of 186×214 mm in a central portion thereof. There are eight screw holes 203 provided around the opening 210 of the case 20 to fix the internal unit 50.

The components of the electronic equipment will be described with reference to FIG. 4. Incidentally, FIG. 4 is a cross-sectional view taken along line A-A of FIG. 3. In FIG. 4, the electronic equipment is configured such that the heat sink cover 10 is attached to the case 20, in which the internal unit 50 is installed, and then covered with the cover 30.

The cover 30 has door-side hinge portions 42 which are engaged with the frame-side hinge portions 41 of FIG. 3, and thus the hinges 40 are formed. The internal unit 50 includes a heat sink 530, a radiation fin 540, a thermally conductive sheet 550, an electronic component 560, a board 520, a sealed case 510, and sealed case fixing screws 580. The electronic component 560 is mounted to the board 520, in which heat is transmitted to the heat sink 530 through the thermally conductive sheet 550 and is radiated to the air outside of the enclosure from the radiation fin 540. The internal unit 50 is fixed to the case 20 by the eight internal unit fixing screws 570. Upon assembly, the radiation fin 540 and a part of the heat sink 530 are inserted into the opening 210 (186 mm in height). In other words, the internal unit 50 can easily be replaced by simply removing the eight internal unit fixing screws 570.

The cross sectional structure after assembly as the electronic equipment will be described with reference to FIG. 5. FIG. 5 is also a cross-sectional view taken along line A-A of FIG. 3. In FIG. 5, the air entering from the lower air vent 110 of the heat sink cover 10 flows upward while depriving the heat of the radiation fin 540. Then, the air flows out from the upper air vent 120. As shown in FIG. 3, the case 20 has the opening 210 through which the radiation fin 540 is exposed to the outside of the case 20. The size of the opening 210 is determined depending on the size of the radiation fin 540 to be exposed. The size of the radiation fin 540 is determined by the results of a thermal simulation and a temperature test. In the waterproof test, almost all the water can be prevented by the heat sink cover 10. However, the remaining water flowing along the heat sink 530 or the radiation fin 540 inside the heat sink cover 10 is prevented from entering the enclosure 1 by a draining portion which will be described with reference to FIG. 6 and the subsequent figures.

Incidentally, the upper air vent 120 and the lower air vent 110 are not shown in the cross section of the case 10 in FIGS. 4 and 5. This is because the center cross section is taken as A-A cross section. Obviously the upper air vent 120 and lower air vent 110 both having many holes are expressed when other cross sections are taken.

The detail in the vicinity of the canopy portion will be described with reference to FIGS. 6 and 7, which are enlarged views of B portion of FIG. 5.

In FIG. 6, if assuming that a canopy 531 is not provided, water droplets flowing from the upper portion along the heat sink 530 just flows into the enclosure from a gap 60 between the case 20 and the heat sink 530. For this reason, the canopy is provided in the heat sink 530 so that the water droplets flowing from the upper portion along the canopy 531 and falls down from the tip of the canopy 531. Due to the canopy 531, the water droplets are prevented from entering a gap 60 between the case 20 and the heat sink 530. As a result, it is possible to prevent the water penetration into the enclosure 1. Preferably the canopy 531 is long enough to cover the gap 60 between the case 20 and the heat sink 530. However, as shown in FIG. 7, it could make it difficult to install the internal unit 50 to the case 20 due to interference between the case 20 and the canopy 531. For this reason, a length b of the canopy 531 is preferably determined so as not to exceed the size of the opening 210 of the case 20. In the embodiment, a distance a between the opening 210 of the case 20 and the lower canopy 531 is defined as 1.94 mm.

Further, the length b of the canopy 531 may be any value as long as the water droplets can be cut. However, the present inventors consider that preferably the length b is about the same as a height c, because the canopy 531 could be destroyed when it is too long. Also, in order to prevent the destruction of the canopy 531, a wall thickness d should have a certain thickness. In addition, it is necessary to provide a space 532 to prevent the water droplets from entering the gap 60 between the case 20 and the heat sink 530 along the canopy 531. At this time, when the space 532 is small, the water droplets may enter the gap 60 along the canopy 531 during a storm, so that the space 532 should have a certain area. Further, preferably an angle dimension e of the canopy 531 is determined so that the water droplets fall in a direction separating from the gap 60. In the embodiment, the length b is defined as 9.84 mm, the height c as 7.67 mm, the wall thickness d as 3 mm, and the angle e as 10.16 degrees, respectively. The waterproof test was performed under Wind Driven Rain with a sample of the above dimensions, and confirmed that the sample was acceptable.

Incidentally, the draining portion described with reference to FIGS. 6 and 7 is not provided in an upper portion of FIG. 5. This is because even if the water droplets enter the gap 60 in the upper portion of FIG. 5, the water does not flow in a direction against the force of gravity unless a capillary tube is formed therein.

The detailed structure of the heat sink and the case will be described with reference to FIGS. 8 and 9. In FIG. 8, the heat sink 530 includes a first groove 533 and a second groove 534 in the vicinity of the canopy 531. The first and second grooves 533, 534 are continuously present around the outer periphery of the heat sink 530. A hole 535 is a screw hole used for screw fixing the internal unit 50 to the case 20.

While in FIG. 9, the case 20 includes a first rib 201 and a second rib 202. The first and second ribs 201, 202 are continuously present around the opening 210 of the case 20. A screw hole 203 is a lower hole used for screw fixing the internal unit 50 to the case 20.

The first rib 201 is fitted into the first groove 533 upon assembly. Similarly, the second rib 202 is fitted into the second groove 534. Even if the water droplets may not be completely prevented by the canopy 531 and may enter from the gap 60 between the case 20 and the heat sink 530, a first fitting portion between the first groove 533 and the first rib 201 prevents the water from penetrating into the enclosure 1 (water sealing). The first fitting portion has a small space in which the water droplets are held by the surface tension, so that the water is prevented from penetrating into the enclosure. In the embodiment, an f dimension (f1) of the space is defined as 1 mm. The water penetration is also prevented in the fitting portion between the second groove 534 and the second rib 202. Thus, the case has a double water-proof structure. Incidentally, an f dimension (f2) of the second fitting portion is defined as f2<f1 to realize higher water sealing performance.

In FIG. 10, almost all the water droplets flow from the upper portion along the heat sink 530. However, it is possible that water droplets are blown into the case from the lower air vent 110 of the heat sink cover 10 during a storm at an intensity equivalent to the Wind Driven Rain test. In order to prevent this, there is provided a rib 204 in the bottom of the gap 60 between the case 20 and the heat sink 530. The waterproof performance is improved as a height g of the rib is higher. However, when the rib is too high, the air flow to the radiation fin 540 is blocked and the radiation performance is degraded. For this reason, the height g is determined within the range in which the radiation is not blocked. In the embodiment, the value of g is defined as 5 mm. Here, the value of g is determined so that the tip of the rib 204 is located on a line connecting the canopy 531 and the left-end hole on the heat sink 530 side of many holes forming the lower air vent 110.

Figure 11:
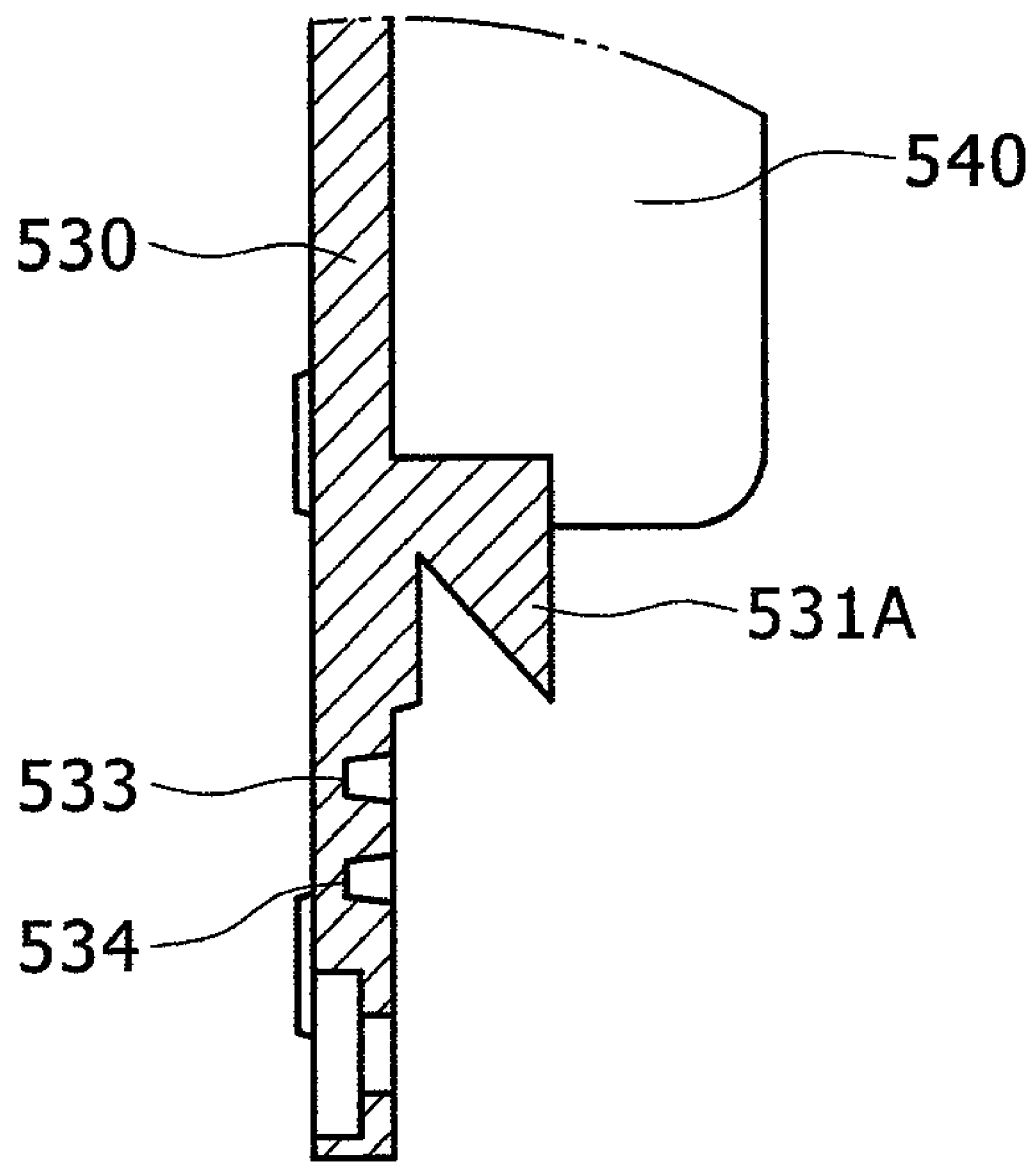
FIG. 11 is another cross-sectional view of a key portion of the electronic equipment.

Next, a variation of the draining portion will be described with reference to FIG. 11. Here, FIG. 11 is a cross-sectional view of a key portion of the electronic equipment. In FIG. 11, although a canopy portion 531A does not extend outwardly, the water is cut in a position sufficiently distant from the enclosure 1 by the grooves 533 and 534. As a result, the water is prevented from entering the enclosure 1.

Incidentally, the draining portion may include other variations than the above described structures of the canopy portions 531 and 531A, as long as the water is cut in the direction of the force of gravity.

According to the present invention, it is possible to provide electronic equipment installed outdoors to house an electronic component and other parts, in which the electronic equipment meets the waterproof standard of North America and allows easy replacement of the electronic component housed therein.

What is claimed is:

1. An electronic equipment comprising:
   an electronic component installed in an enclosure with a cover and a case having an opening; and
   an internal unit including a heat sink and a radiation fin extending from the heat sink in a direction substantially perpendicular thereto for radiating heat generated by the electronic component, the radiation fin being inserted into the opening,
   wherein the heat sink has a canopy extending therefrom in a direction substantially perpendicular to the extending direction of the radiation fin at a position proximate to a bottom of the radiation fin, and
   wherein the canopy is set so as not to exceed an area of the opening of the case.

2. The electronic equipment according to claim 1, further comprising a water sealing portion including a groove and a rib between the case and the heat sink.

3. The electronic equipment according to claim 2, further comprising a rib of the case in the bottom of the canopy in order to prevent spouted water from penetrating into the case.

4. The electronic equipment according to claim 2, further comprising a plurality of the water sealing portions between the case and the heat sink.

5. The electronic equipment according to claim 1, further comprising a rib of the case in the bottom of the canopy in order to prevent spouted water from penetrating into the case.

6. The electronic equipment according to claim 1, wherein the canopy extends so as to cover a gap between the case and the heat sink.

7. The electronic equipment according to claim 1, wherein the canopy has a slope portion which extends outwardly.

8. An electronic equipment comprising:
   an electronic component installed in an enclosure with a cover and a case having an opening; and
   an internal unit including a heat sink and a radiation fin extending from the heat sink in a direction substantially perpendicular thereto for radiating heat generated by the electronic component, the radiation fin being inserted into the opening,
   wherein the heat sink has a canopy extending therefrom in a direction substantially perpendicular to the extending direction of the radiation fin at a position proximate to a bottom of the heat sink, and
   wherein the canopy is set so as not to exceed an area of the opening of the case.

9. The electronic equipment according to claim 8, further comprising a water sealing portion including a groove and a rib between the case and the heat sink.

10. The electronic equipment according to claim 9, further comprising a rib of the case in the bottom of the canopy in order to prevent spouted water from penetrating into the case.

11. The electronic equipment according to claim 9, further comprising a plurality of the water sealing portions between the case and the heat sink.

12. The electronic equipment according to claim 8, further comprising a rib of the case in the bottom of the canopy in order to prevent spouted water from penetrating into the case.

13. The electronic equipment according to claim 8, wherein the canopy extends so as to cover a gap between the case and the heat sink.

14. The electronic equipment according to claim 8, wherein the canopy has a slope portion which extends outwardly.

* * * * *